United States Patent
Lee et al.

(10) Patent No.: US 12,108,621 B2
(45) Date of Patent: Oct. 1, 2024

(54) DISPLAY DEVICE

(71) Applicant: Samsung Display Co., LTD., Yongin-si (KR)

(72) Inventors: Jun Hee Lee, Hwaseong-si (KR); Yeong Ho Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 143 days.

(21) Appl. No.: 17/210,614

(22) Filed: Mar. 24, 2021

(65) Prior Publication Data

US 2022/0020955 A1  Jan. 20, 2022

(30) Foreign Application Priority Data

Jul. 15, 2020  (KR) .................. 10-2020-0087559
Feb. 22, 2021  (KR) .................. 10-2021-0023412

(51) Int. Cl.
*H10K 50/844* (2023.01)
*H10K 59/122* (2023.01)
*H10K 59/131* (2023.01)
*H10K 59/38* (2023.01)

(52) U.S. Cl.
CPC ......... *H10K 50/844* (2023.02); *H10K 59/122* (2023.02); *H10K 59/131* (2023.02); *H10K 59/38* (2023.02)

(58) Field of Classification Search
CPC . H01L 27/322; H01L 2/3276; H01L 27/3246; H01L 27/3244; H01L 51/5253; H01L 2251/558; H10K 59/38; H10K 59/122; H10K 59/131; H10K 50/844

See application file for complete search history.

(56) References Cited

U.S. PATENT DOCUMENTS

| | | | |
|---|---|---|---|
| 2009/0261712 A1* | 10/2009 | Choi ................ | H10K 59/122 257/E51.021 |
| 2019/0096968 A1* | 3/2019 | Zhang .............. | H10K 50/115 |
| 2019/0096975 A1* | 3/2019 | Park ................ | H10K 59/873 |
| 2019/0296088 A1* | 9/2019 | Kim ................. | H10K 59/38 |
| 2019/0341439 A1* | 11/2019 | Choi ................ | G09G 3/3291 |
| 2020/0119304 A1* | 4/2020 | Choi ................ | H10K 59/12 |
| 2021/0020733 A1* | 1/2021 | Saida ............... | H05B 33/06 |
| 2021/0249631 A1* | 8/2021 | Kokame ........... | H10K 59/122 |

FOREIGN PATENT DOCUMENTS

| | | |
|---|---|---|
| JP | 2010282899 | 12/2010 |
| KR | 1019940004297 | 5/1994 |
| KR | 1020150072749 | 6/2015 |
| KR | 1020170021422 | 2/2017 |
| KR | 1020180003253 | 1/2018 |
| KR | 1020180138253 | 12/2018 |

* cited by examiner

*Primary Examiner* — Vongsavanh Sengdara
(74) *Attorney, Agent, or Firm* — CANTOR COLBURN LLP

(57) ABSTRACT

A display device includes a substrate including a display area and a non-display area, a light emitting element disposed in the display area, an encapsulation layer covering the light emitting element, and a dam disposed in the non-display area and surrounding the display area. The dam includes a plurality of layers, and the plurality of layers include an organic layer that includes a portion that decreases and then increases in height toward an edge of the organic layer.

18 Claims, 15 Drawing Sheets

DISPLAY DEVICE

This application claims priority to Korean Patent Application No. 10-2020-0087559, filed on Jul. 15, 2020, and all the benefits accruing therefrom under 35 U.S.C. §119, the content of which in its entirety is herein incorporated by reference.

BACKGROUND

(a) Field

Embodiments of the invention relate to a display device.

(b) Description of the Related Art

A display device such as an emissive display device includes a display panel on which a screen on which an image is displayed is disposed. The display panel is manufactured by forming several layers and elements on a substrate.

The display panel may include an encapsulation layer which may block inflow of moisture or oxygen to protect elements formed on the substrate from an external environment. In addition, the display panel may include an anti-reflection layer to reduce reflection of external light.

In recent years, a flexible display panel that is lightweight, resistant to impact, and easy to deform by a flexible substrate has been developed.

SUMMARY

Embodiments provide a display device that is thin and lightweight and capable of improving reliability.

An embodiment provides a display device including a substrate including a display area and a non-display area, a light emitting element disposed in the display area, an encapsulation layer covering the light emitting element, and a dam disposed in the non-display area and surrounding the display area. The dam includes a plurality of layers, and the plurality of layers include an organic layer that includes a portion that decreases and then increases in height toward an edge of the organic layer.

In an embodiment, the organic layer may include a black photoresist.

In an embodiment, the organic layer may include a first portion adjacent to the edge and a second portion disposed inside the first portion, and a height of the first portion may be greater than a height of the second portion.

In an embodiment, at least two inflection points may be included in a curve defined by an upper surface of an edge portion of the organic layer in a cross-sectional view.

In an embodiment, the display device may further include a power supply voltage transfer line disposed in the non-display area, and the organic layer may include a portion that is in contact with the power supply voltage transfer line.

In an embodiment, the display device may further include a connecting member electrically connecting an electrode of the light emitting element and the power supply voltage transfer line, and the organic layer may include a portion that is in contact with the connecting member.

In an embodiment, the display device may further include an insulating layer disposed between the substrate and the power supply voltage transfer line, and the organic layer may include a portion that is in contact with the insulating layer.

In an embodiment, the encapsulation layer may include an inorganic layer, and the inorganic layer may extend over the organic layer and may contact the organic layer.

In an embodiment, the display device may further include a black pixel defining layer which is disposed in the display area and in which an opening is defined, and a height of a first portion of the black pixel defining layer adjacent to an edge of the black pixel defining layer for defining the opening may be greater than a height of a second portion disposed farther from the opening than the first portion is from the opening.

In an embodiment, the display device may further include a light blocking member and a color filter disposed on the black pixel defining layer to overlap the black pixel defining layer.

An embodiment provides a display device including a substrate including a display area and a non-display area, a black pixel defining layer which is disposed in the display area and in which an opening is defined, a light emitting diode disposed in the display area and overlapping the opening, a thin film encapsulation layer covering the light emitting diode, and a dam disposed in the non-display area and surrounding the display area. The dam may include a first layer and a second layer that cover an upper surface and a side surface of the first layer, and the second layer includes a same material as that of the black pixel defining layer.

In an embodiment, the black pixel defining layer and the second layer may include a black photoresist.

In an embodiment, the second layer may include a first portion adjacent to an edge of the second layer and a second portion disposed inside the first portion, and a height of the first portion may be greater than a height of the second portion.

In an embodiment, at least three inflection points may be included in a curve defined by an upper surface and a side surface of an edge portion of the second layer in a cross-sectional view.

In an embodiment, the display device may further include a power supply voltage transfer line disposed in the non-display area, and the second layer may include a portion that is in contact with the power supply voltage transfer line.

In an embodiment, the display device may further include a connecting member electrically connecting an electrode of the light emitting diode and the power supply voltage transfer line, and the second layer may include a portion that is in contact with the connecting member.

In an embodiment, the display device may further include an insulating layer disposed between the substrate and the power supply voltage transfer line, and the second layer may include a portion that is in contact with the insulating layer.

In an embodiment, the thin film encapsulation layer may include an inorganic layer, and the inorganic layer may extend over the second layer and may contact the second layer.

In an embodiment, the display device may further include a planarization layer disposed between the substrate and the black pixel defining layer, and the first layer may include a same material as that of the planarization layer.

In an embodiment, the display device may further include a light blocking member and a color filter disposed on the black pixel defining layer and overlapping the black pixel defining layer.

According to the embodiments, it is possible to provide a display device that is thin and lightweight and capable of improving reliability. In addition, although not specifically mentioned, in embodiments, advantageous effects that may be recognized throughout the specification may be provided.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1:
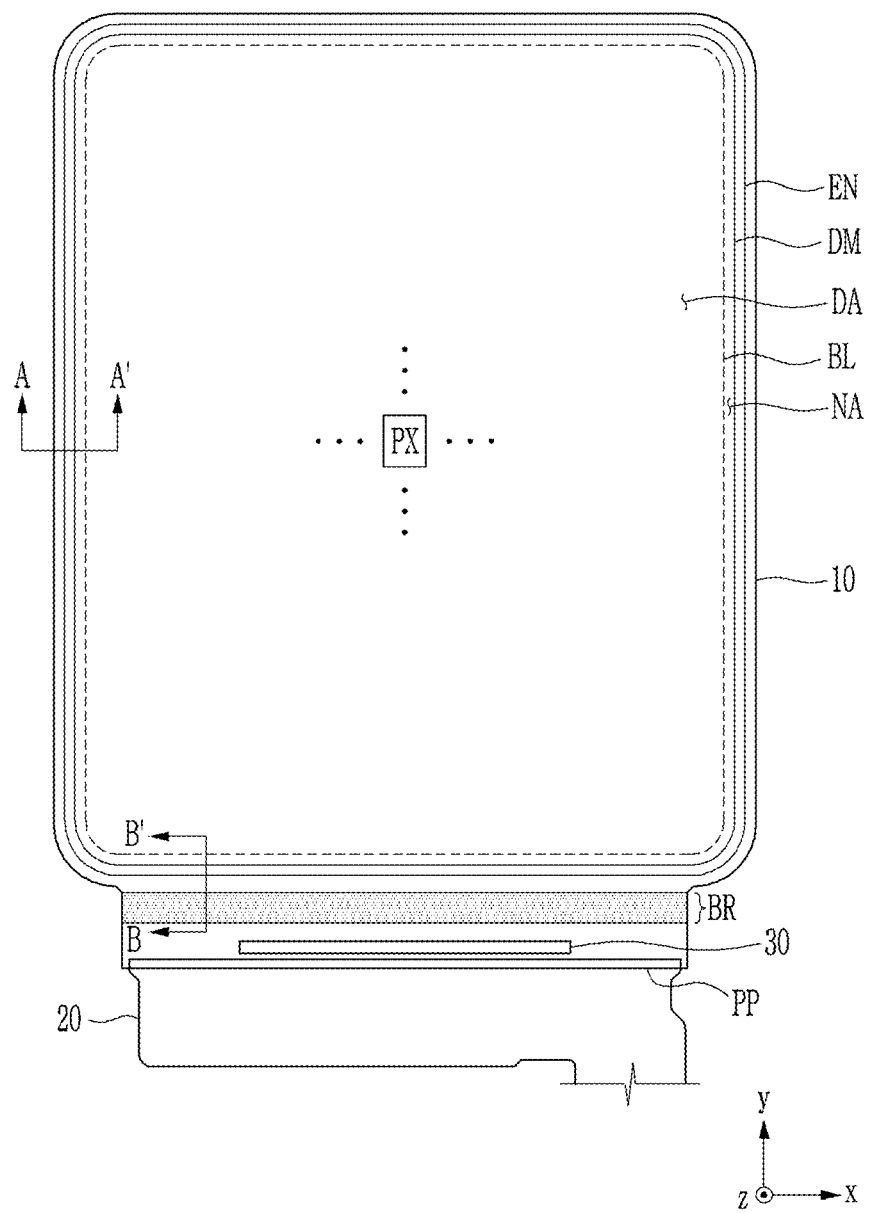
FIG. 1 illustrates a schematic top plan view of an embodiment of a display device.

Embodiments of the invention will be described more fully hereinafter with reference to the accompanying drawings, in which embodiments are shown.

Further, sizes and thicknesses of constituent elements shown in the accompanying drawings are arbitrarily given for better understanding and ease of description.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In addition, in the specification, when a part "includes" a certain component, this means that other components may be further included unless specifically stated to the contrary.

In the drawings, signs "x", "y", and "z" are used to indicate directions, where x is used for indicating a first direction, y is used for indicating a second direction that is perpendicular to the first direction, and z is used for indicating a third direction that is perpendicular to the first direction and the second direction. The first direction x, the second direction y, and the third direction z may correspond to a horizontal direction, a vertical direction, and a thickness direction of the display device, respectively.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise described in the specification, "overlapping" indicates overlapping in a plan view, and indicates overlapping in the third direction z.

FIG. 1 illustrates a schematic top plan view of an embodiment of a display device.

Referring to FIG. 1, the display device includes a display panel 10, a flexible printed circuit film 20 bonded to the display panel 10, and a driving unit including an integrated circuit ("IC") chip 30, etc.

The display panel 10 includes a display area DA corresponding to a screen on which an image is displayed and a non-display area NA, and circuits and/or signal lines for generating and/or transferring various signals and voltages applied to the display area DA disposed around the display area DA are disposed in the non-display area NA. The non-display area NA may be disposed to surround a periphery of the display area DA. In FIG. 1, inside and outside of a boundary line BL correspond to the display area DA and the non-display area NA, respectively.

Pixels PX are disposed in a matrix form in the display area DA of the display panel 10. However, the invention is not limited thereto, and pixels PX may be disposed in various other shapes. Signal lines such as a scan line, a data line, a driving voltage line, and an initializing voltage line may be disposed in the display area DA. The scan line may extend approximately in a first direction x, and the data line and the driving voltage line may extend approximately in a second direction y. The initializing voltage line may include a voltage line extending approximately in the first direction x and a voltage line extending approximately in the second direction y, and may be disposed in a mesh shape. Each pixel PX may be connected to the scan line, the data line, the driving voltage line, the initializing voltage line, and the like to receive a scan signal, a data voltage, a driving voltage, and an initializing voltage from these signal lines. Each pixel PX may also receive a common voltage. In an embodiment, the pixel PX may be implemented as a light emitting element such as a light emitting diode.

A touch sensor for sensing a user's touch and/or a non-contact touch may be disposed in the display area DA. Although the display area DA having a quadrangular shape with rounded corners is illustrated, the display area DA may have various shapes such as a polygonal shape, a circular shape, an elliptical shape, and the like.

A pad portion PP in which pads for receiving signals from the outside of the display panel 10 may be disposed in the non-display area NA of the display panel 10. The pad portion PP may be disposed to extend in a first direction x along one edge of the display panel 10. The flexible printed circuit film 20 is bonded to the pad portion PP, and pads of the flexible printed circuit film 20 may be electrically connected to pads of the pad portion PP.

The driving unit may be disposed in the non-display area NA of the display panel 10 to generate and/or process various signals for driving the display panel 10. The driving unit includes a data driver for applying a data voltage to the data lines, a scan driver for applying a scan signal to the scan lines, and a signal controller for controlling the data driver and the scan driver. Pixels PX may receive the data voltage at predetermined timing depending on a scan signal generated by the scan driver. The scan driver may be integrated in the display panel 10, and may be disposed on at least one side of the display area DA. The data driver and the signal controller may be provided as an IC chip (also referred to as a driving IC chip) 30, and the IC chip 30 may be disposed (e.g., mounted) in the non-display area NA of the display panel 10. The IC chip 30 may be disposed (e.g., mounted) on the flexible printed circuit film 20 or the like to be electrically connected to the display panel 10.

The display panel 10 may include an encapsulation layer EN entirely covering the display area DA. The encapsulation layer EN may cover and seal the display area DA to prevent moisture or oxygen from penetrating into the display panel 10. An edge of the encapsulation layer EN may be disposed between an edge of the display panel 10 and the display area DA. A dam DM surrounding the display area DA may be disposed in the non-display area NA. The dam DM may prevent a material for forming the encapsulation layer EN, particularly an organic material such as a monomer, from overflowing to the outside of the display panel 10. The display panel 10 may include at least one dam DM, and each dam DM may completely surround the display area DA.

The display panel 10 may include a bending region BR. The bending region BR may be disposed in the non-display area NA between the display area DA and the pad portion PP. The bending region BR may be disposed across the display panel 10 in the first direction x. The display panel 10 may be bent at a predetermined radius of curvature about a bending axis parallel to the first direction x in the bending region BR. When the display panel 10 is a top emission type, the display panel 10 may be bent such that the pad portion PP and the flexible printed circuit film 20, which are farther from the display area DA than the bending region BR is from the display area DA, may be disposed behind the display panel 10. The display panel 10 may be in a bent state when a display device including the display panel 10 is applied to an electronic device. The bending region BR may be bent about one bending axis, and may be bent about two or more bending axes. In the drawing, although the bending region BR is illustrated to be disposed in the non-display area NA, the bending region BR may be disposed over the display area DA and the non-display area NA, or may be disposed in the display area DA.

Figure 2:
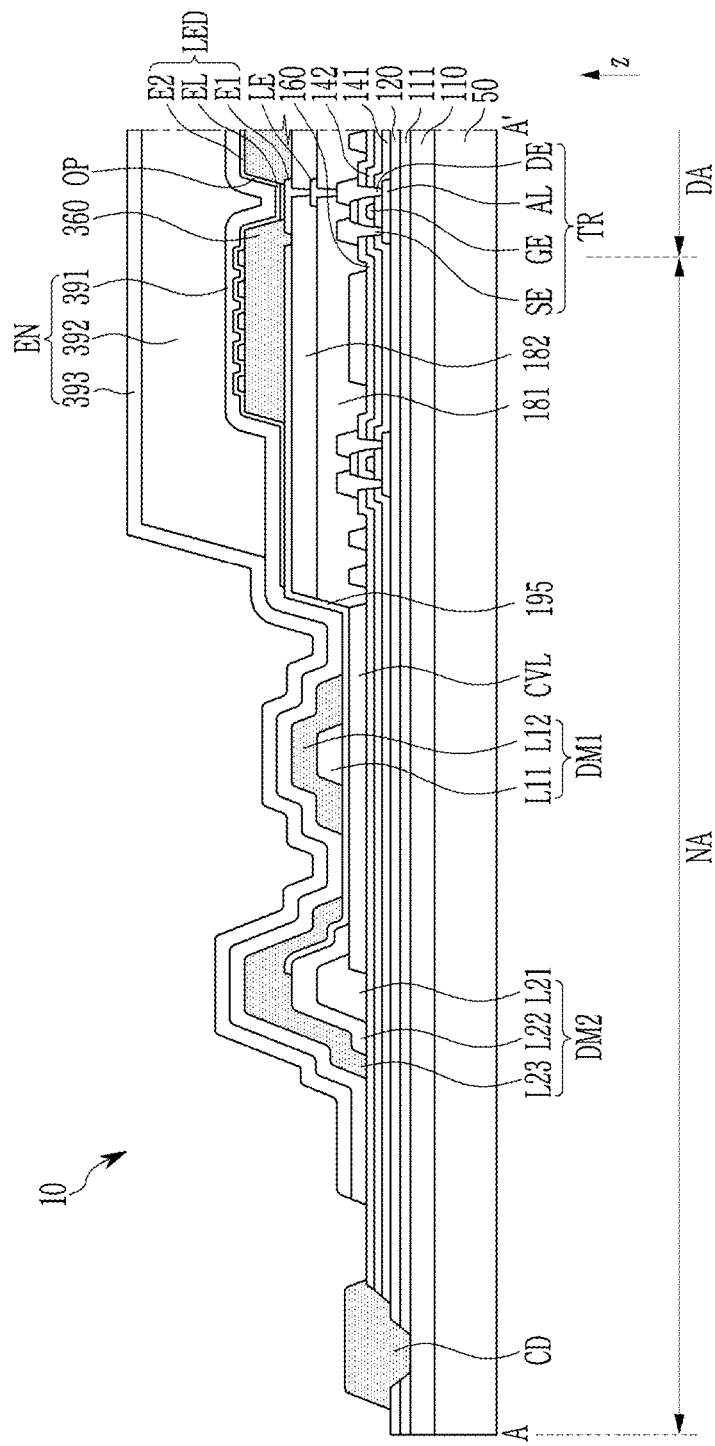
FIG. 2 illustrates a schematic cross-sectional view taken along line A-A' of an embodiment of FIG. 1.
Figure 3A:
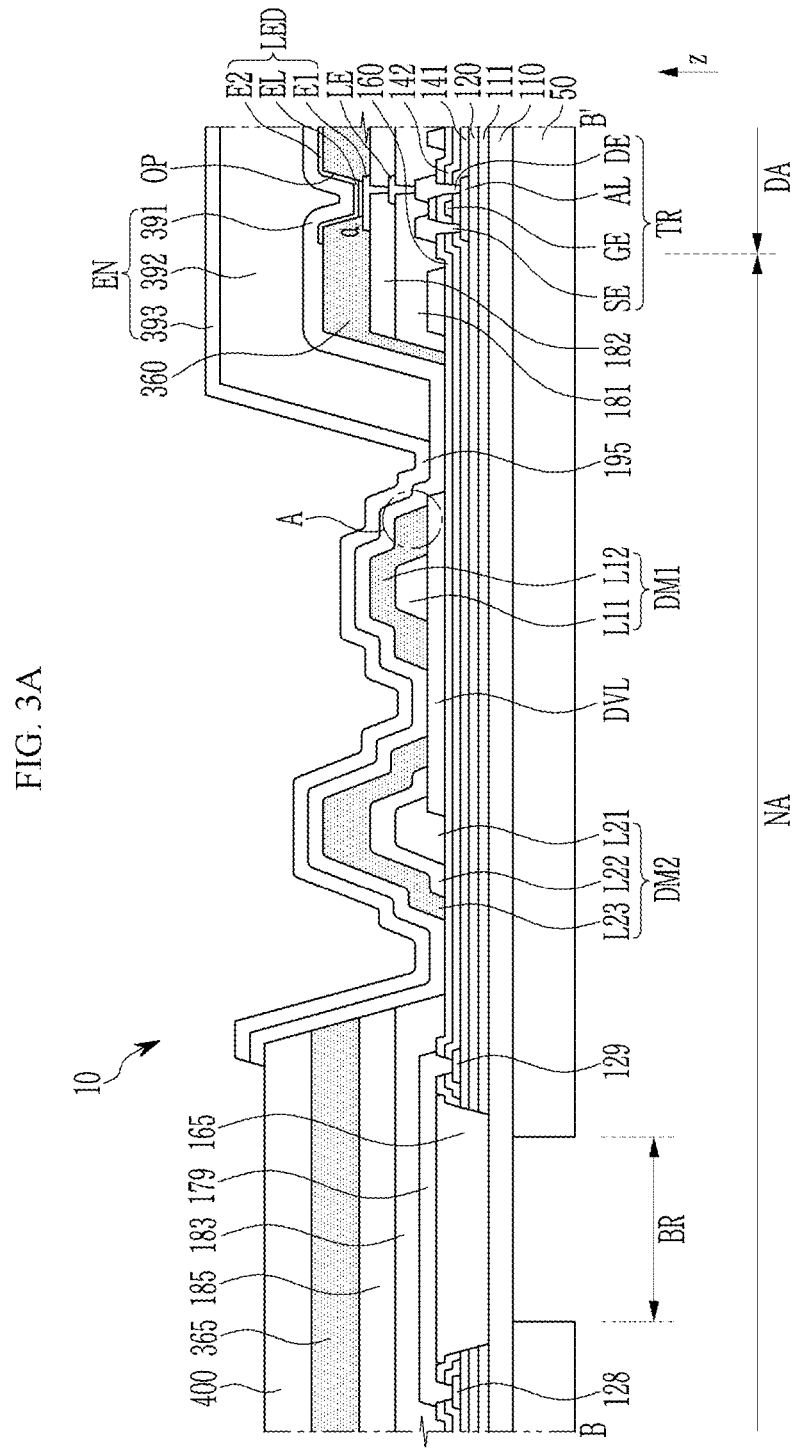
FIG. 3A illustrates a schematic cross-sectional view taken along line B-B' of an embodiment of FIG. 1.
Figure 3B:
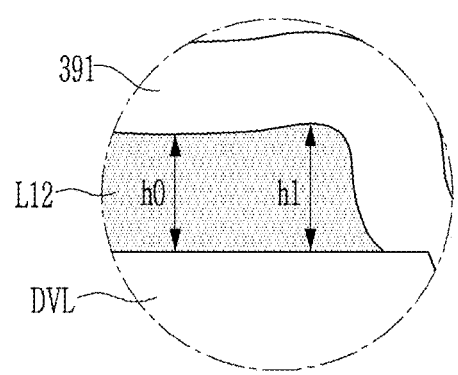
FIG. 3B is an enlarged view of a portion A of FIG. 3A.

FIG. 2 illustrates a schematic cross-sectional view taken along line A-A' of an embodiment of FIG. 1, FIG. 3A illustrates a schematic cross-sectional view taken along line B-B' of an embodiment of FIG. 1, and FIG. 3B is an enlarged view of a portion A of FIG. 3A.

Referring to FIG. 2 and FIGS. 3A and 3B, a cross-section near the left edge of display panel 10 is schematically illustrated. A vicinity of a right edge of the display panel 10 may have a cross-sectional structure that is substantially symmetrical with a vicinity of a left edge thereof.

The display panel 10 includes a substrate 110 and various layers, wires, and elements disposed thereon. Although a plurality of pixels is arranged in the display area DA of the display panel 10, only one pixel will be briefly illustrated in order to avoid complication of the drawings to be described. In addition, although each pixel includes transistors, a capacitor, and a light emitting diode, a stacked structure of the display panel 10 will be described, focusing on one transistor TR and one light emitting diode LED connected thereto.

The substrate 110 may be a flexible substrate. In an embodiment, the substrate 110 may include a polymer such as polyimide, polyamide, polycarbonate, or polyethylene terephthalate. In an embodiment, the substrate 110 may have a multi-layered structure including, e.g., two polymer layers and a barrier layer therebetween.

A barrier layer 111 may be disposed on the substrate 110, and a buffer layer 120 may be disposed on the barrier layer 111. The barrier layer 111 may prevent moisture and oxygen from penetrating into the display panel 10. The buffer layer 120 may block impurities that may diffuse from the substrate 110 to a semiconductor layer, and may reduce stress applied to the substrate 110 in a process of forming the semiconductor layer.

A semiconductor layer AL of a transistor TR may be disposed on the buffer layer 120. The semiconductor layer AL may include a channel region overlapping the gate electrode GE and source and drain regions disposed at opposite sides thereof. In an embodiment, the semiconductor layer AL may include polysilicon, amorphous silicon, or an oxide semiconductor.

A first gate insulating layer 141 may be disposed on the semiconductor layer AL.

A first gate conductor including a gate electrode GE of the transistor TR, and the like may be disposed on the first gate insulating layer 141. The first gate conductor may be provided by a same material in a same process. A second gate insulating layer 142, which may include an electrode of a storage capacitor, and the like, may be disposed on the first gate conductor. The second gate conductor may be provided by a same material in a same process. A second gate conductor may be disposed on the second gate insulating layer 142. An inter-insulating layer 160 may be disposed on the second gate conductor.

The buffer layer 120, the first gate insulating layer 141, the second gate insulating layer 142, and the inter-insulating layer 160 may include an inorganic insulating material such as a silicon oxide and a silicon nitride. In an embodiment, each of the first and second gate conductive layers may include a metal such as molybdenum (Mo), copper (Cu), aluminum (Al), silver (Ag), chromium (Cr), tantalum (Ta), titanium (Ti), or an alloy thereof.

A first data conductor that may include a source electrode SE and a drain electrode DE of the transistor TR, a driving voltage transfer line DVL, a common voltage transfer line CVL, and a connection wire 179 may be disposed on the inter-insulating layer 160. The first data conductor may be provided by a same material in a same process. The source electrode SE and the drain electrode DE may be connected to a source region and a drain region of the semiconductor layer AL through contact holes defined in the inter-insulating layer 160, the second gate insulating layer 142, and the first gate insulating layer 141. The driving voltage transfer line DVL and the common voltage transfer line CVL are power supply voltage transfer lines, the driving voltage transfer line DVL may transfer a driving voltage ELVDD (refer to FIG. 13), and the common voltage transfer line CVL may transfer a common voltage ELVSS (refer to FIG. 13).

The gate electrode GE, the source electrode SE, and the drain electrode DE constitute the transistor TR together with the semiconductor layer AL. The transistor TR may be a driving transistor in the pixel PX of the emissive display device, or may be a transistor electrically connected to the driving transistor. In the illustrated transistor TR, a gate electrode GE is disposed above the semiconductor layer AL, but a structure of the transistor may be variously changed.

A first planarization layer 181 may be disposed on the first data conductor. A second data conductor that may include a data line 171 (refer to FIG. 13), a driving voltage line 172 (refer to FIG. 13), and a connection electrode LE may be disposed on the first planarization layer 181. The connection electrode LE may be connected to the drain electrode DE of the transistor TR through a contact hole defined in the first planarization layer 181. The second data conductor may be provided by a same material in a same process. A second planarization layer 182 may be disposed on the second data conductor.

In an embodiment, each of the first and second data conductors may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. In an embodiment, the first data conductor and/or the second data conductor may be a multilayer such as titanium (Ti)/aluminum (Al)/titanium (Ti).

Each of the first and second planarization layers 181 and 182 may include an organic insulating material such as an acrylic polymer, a siloxane polymer, or an imide polymer. Each of the first and second planarization layers 181 and 182 may serve to eliminate steps and perform planarization to increase luminous efficiency of the light emitting diode display to be disposed thereon. A passivation layer including an inorganic insulating material may be disposed between the first planarization layer 181 and the first data conductor. A passivation layer may be disposed instead of the first planarization layer 181.

A first electrode E1 of the light emitting diode LED is disposed on the second planarization layer 182. The first electrode E1 may be connected to the connection electrode LE through a contact hole defined in the second planarization layer 182.

Since the connection electrode LE is connected to the drain electrode DE, the first electrode E1 may be electrically connected to the drain electrode DE through the connection electrode LE. In another embodiment, the first electrode E1 may be directly connected to the drain electrode DE. The transistor TR to which the first electrode E1 is connected may be a driving transistor or a light emission control transistor that is electrically connected to the driving transistor. The first electrode E1 may include a reflective conductive material or a translucent conductive material, or may include a transparent conductive material. In an embodiment, the first electrode E1 may include a transparent conductive material such as an indium tin oxide ("ITO") or an indium zinc oxide ("IZO"). In an embodiment, the first electrode E1 may include a metal such as lithium (Li), calcium (Ca), aluminum (Al), silver (Ag), magnesium (Mg), or gold (Au).

A connecting member 195 connected to the common voltage transfer line CVL may be disposed on the second planarization layer 182. Portions of the first and second planarization layers 181 and 182 overlapping the common voltage transfer line CVL may be removed in order to connect the connecting member 195 and the common voltage transfer line CVL. The connecting member 195 may include a same material in a same process as those of the first electrode E1.

A pixel defining layer 360 in which an opening OP overlapping the first electrode E1 is defined may be disposed on the second planarization layer 182. The pixel defining layer 360 may be also referred to as a partition. The pixel defining layer 360 may include an organic insulating material such as an acryl-based polymer, an imide-based polymer, and an amide-based polymer. The pixel defining layer 360 may be a black pixel defining layer 360 including a black pigment or dye. The black pixel defining layer 360 may improve a contrast ratio, and may prevent reflection by a metal layer disposed therebelow.

The pixel defining layer 360 may be provided by patterning a black photoresist through a photolithography process. The photoresist may be a photosensitive compound in which a black pigment or dye is dispersed, and the photosensitive compound may include a polymer, a monomer, and a photopolymerization initiator. A negative photoresist may be used as a black photoresist.

Formation of the pixel defining layer will now be described. A black photoresist is coated on the second planarization layer 182 on which the first electrode E1 is disposed, and it is patterned by selectively irradiating light using a photolithography process, e.g., using a mask, and by performing development. A region of the coated photoresist to which light is not irradiated may be removed by a developer, thereby exposing at least a portion of the first electrode E1. The removed region may correspond to the opening OP.

After the photoresist is developed, curing is typically performed. The curing may be also referred to as baking, burning, firing, or the like. The curing may be performed in an oven at a predetermined temperature (e.g., about 230 degrees Celsius (° C.) to about 250° C.) for a predetermined time (e.g., about 30 minutes (min) to about 60 min). During curing, the photoresist may reflow due to a high temperature, so that the photoresist may spread to the opening OP, and a width of the opening OP may be reduced. Since an influence of the flow or spread of the photoresist is not uniform for all the openings OP, dispersion or variation occurs in a width of the openings OP. The dispersion of the width of the opening OP may deteriorate the luminance and color uniformity of the display device.

The full exposure is performed after development and before curing in order to improve the flow of the photoresist which may cause the dispersion of the width of the opening OP. The full exposure may mean irradiating light (e.g., ultraviolet light) to the photoresist without using a mask. The flow of the photoresist during curing may be particularly problematic in the black photoresist, which may be due to insufficient polymerization of the black photoresist in the photolithography process. Photoresist photopolymerization and photocuring are further promoted by the full exposure, and the flow of the photoresist during curing may be reduced because an edge portion of the photoresist, which may have a large exposure amount per unit volume, serves as a dam. Even though the pixel defining layer 360 is an organic insulating layer, by suppressing the flow of the photoresist, a taper angle a at the edge portion of the opening OP may be about 45° or more, e.g., about 45° to about 65°.

An emission layer EL may be disposed on the first electrode E1. In addition to the emission layer EL, at least one of a hole injection layer, a hole transport layer, an electron transport layer, and an electron injection layer may be disposed on the first electrode E1.

A second electrode E2 of the light emitting diode LED is disposed on the emission layer EL. The second electrode E2 may be electrically connected to the common voltage transfer line CVL through the connecting member 195 to receive the common voltage ELVSS. In an embodiment, the second electrode E2 may include a transparent conductive material such as an ITO or an IZO. In an embodiment, the second electrode E2 may include a metal such as calcium (Ca), barium (Ba), magnesium (Mg), aluminum (Al), or silver (Ag). At least one protective layer or functional layer may be disposed on the second electrode E2.

The first electrode E1, the emission layer EL, and the second electrode E2 may constitute a light emitting diode LED, which may be an organic light emitting diode. The first electrode E1 may be an anode which is a hole injection electrode and the second electrode E2 may be a cathode which is an electron injection electrode, or vice versa. The first electrode E1 may be also referred to as a pixel electrode, and the second electrode E2 may be also referred to as a common electrode.

An encapsulation layer EN may be disposed on the second electrode E2. The encapsulation layer EN may encapsulate a light emitting diode LED to prevent moisture or oxygen from penetrating from the outside. The encapsulation layer EN may include one or more inorganic layers and one or more organic layers which are stacked on the second electrode E2. In the illustrated embodiment, the encapsulation layer EN is a thin film encapsulation layer including a first inorganic layer 391, a second inorganic layer 393, and an organic layer 392 therebetween. The first inorganic layer 391 and the second inorganic layer 393 covering side surfaces of the organic layer 392 are wider than the organic layer 392, and the first inorganic layer 391 and the second inorganic layer 393 may contact each other in an edge region of the encapsulation layer EN. In an embodiment, the organic layer 392 may include an acryl-based resin, a methacrylic resin, polyisoprene, a vinyl-based resin, an epoxy-based resin, a urethane-based resin, a cellulose-based resin, a perylene-based resin, and the like. The encapsulation layer EN may be provided in a form of a substrate.

The first dam DM1 and the second dam DM2 may be disposed above the inter-insulating layer 160 in the non-display area NA. When the organic layer 392 of the encapsulation layer EN is provided, the first dam DM1 and the second dam DM2 may prevent an organic material such as a monomer from flowing out, and accordingly, an edge of the organic layer 392 of the encapsulation layer EN may be disposed at least inside the second dam DM2, i.e., between the second dam DM2 and the display area DA, or between the first dam DM1 and the display area DA. The first inorganic layer 391 and the second inorganic layer 393 constituting the encapsulation layer EN may extend above the first dam DM1 and the second dam DM2. In this case, a contact area between the first inorganic layer 391 and the second inorganic layer 393 may increase to increase adhesion between the first inorganic layer 391 and the second inorganic layer 393. The first inorganic layer 391 may contact surfaces of the first dam DM1 and the second dam DM2.

The first dam DM1 may be disposed closer to the display area DA than the second dam DM2 is to the display area DA. The first dam DM1 may surround the display area DA, and the second dam DM2 may surround the display area DA and the first dam DM1. The second dam DM2 may be higher than the first dam DM1, or vice versa, but are not limited thereto, and the first dam DM1 and the second dam DM2 may be substantially the same.

The first dam DM1 may include a first layer L11 and a second layer L12. The second layer L12 may completely cover the first layer L11. That is, the second layer L12 may cover not only an upper surface of the first layer L11 but also a side surface thereof, and may contact the upper surface and the side surface of the first layer L11. The first layer L11 may include a same material in a same process as those of the second planarization layer 182. The second layer L12 may include a same material in a same process as those of the pixel defining layer 360.

The second dam DM2 may include a first layer L21, a second layer L22, and a third layer L23. The first layer L21 may include a same material in a same process as those of the first planarization layer 181. The second layer L22 may include a same material in a same process as those of the second planarization layer 182. The third layer L23 may include a same material in a same process as those of the pixel defining layer 360. The second layer L22 may completely cover the first layer L21. The third layer L23 may completely cover the second layer L22 and the first layer L21. A connecting member 195 may be disposed between the second layer L22 and the third layer L23.

When the second layer L12 of the first dam DM1 consists of or includes the same material in the same process as those of the pixel defining layer 360, the second layer L12 may be fully exposed after the photolithography process and before curing. Accordingly, the second layer L12 may be provided such that a first height h1 of a portion that is adjacent to an edge thereof may be greater than a reference height h0 of an inner portion thereof in a region that does not overlap the first layer L11. For convenience, in FIGS. 3A and 3B, although a thickness of the second layer L12 is expressed by the first height h1 and the reference height h0, the first height h1 and the reference height h0 are intended to be heights from the surface of the substrate 110. In an embodiment, a portion having the first height h1 may be about 1.0 micrometer (µm) to about 2.0 µm away from the edge, and the first height h1 may be greater than the reference height h0 by about 0.3 µm to about 0.5 µm. The first height h1 may be in a range of about 1.5 µm to about 2.2 µm. As described above, a portion having the first height h1 greater than the reference height h0 may function as an overflow bump for the material forming the organic layer 392 of the encapsulation layer EN, and may be effective in preventing the material forming the organic layer 392 from passing over the dam DM1.

The reference height h0 and the first height h1 may be inflection points in a curved line defined by an upper surface of the second layer L12 in the cross-sectional view. That is, the second layer L12 may gradually decrease to the reference height h0 along a direction toward the edge, may gradually increase to the first height h1 after passing the reference height h0, and may gradually decrease after passing the first height h1. In an embodiment, a taper angle of the second layer L12 may be about 45° or more, e.g., about 45° to about 65°.

When the third second layer L23 of the second dam DM2 includes the same material in the same process as those of the pixel defining layer 360, the third layer L23 may be fully exposed after the photolithography process and before curing. The third layer L23 may have a structure and a feature of an edge portion corresponding to the second layer L12 of the first dam DM1 described above.

A crack dam CD may be disposed near an edge of the display panel 10. When an impact or stress is applied to the edge of the display panel 10, a crack may be generated in the barrier layer 111, the buffer layer 120, the first gate insulating layer 141, the second gate insulating layer 142, and the inter-insulating layer 160, which may be inorganic insulating layers, to propagate. At least a portion of the inorganic insulating layers may be removed near the edge of the display panel 10, and the crack dam CD may cover the removed portion in order to prevent such crack propagation. The crack dam CD may be a single layer or a multiple layer, and may include a same material in a same process as those of the first planarization layer 181, the second planarization layer 182, and/or the pixel defining layer 360. When the crack dam CD includes the same material in the same process as those of the pixel defining layer 360, the crack dam CD may have a structure and a feature corresponding to the second layer L12 of the first dam DM1 described above.

A protection film 50 may be disposed on a back surface of the substrate 110. The protection film 50 may protect the substrate 110 from physical contact etc., by covering the back surface of the substrate 110. The protection film 50 may be attached to the back surface of the substrate 110 by an adhesive, or may be provided by coating a resin on the back surface of the substrate 110 and curing it.

The bending region BR will now be described. A connection wire 179 for electrically connecting a first wire 128 and a second wire 129 disposed at opposite sides of the bending region BR may be disposed. Accordingly, signals outputted from the IC chip 30 may be transferred to the display area DA, the scan driver, and the like through the second wire 129, the connection wire 179, and the first wire 128. Since the connection wire 179 is bent when the bending region BR is bent, the connection wire 179 may include a metal having good flexibility and a small Young's modulus. The connection wire 179 may include a same material in a same process as those of the source electrode SE and the drain electrode DE. When the flexibility of the connection wire 179 increases, the stress on the strain is reduced, thereby decreasing the risk of deterioration (for example, cracking) or disconnection during bending.

A first protection layer 165 is disposed between the substrate 110 and the connection wire 179 in the bending region BR. The first protection layer 165 may include an organic insulating material such as a polyimide, an acryl-based polymer, or a siloxane-based polymer. A second protection layer 183, a third protection layer 185, and/or a fourth protection layer 365 are disposed on the connection wire 179. The second protection layer 183, the third protection layer 185, and the fourth protection layer 365 may include the same material in the same process as those of the first planarization layer 181, the second planarization layer 182, and the pixel defining layer 360, respectively. A bending protection layer 400 may be disposed on the fourth protection layer 365 to release a tensile stress and to protect the connection wire 179. The bending protection layer 400 may be also referred to as a stress neutralization layer. The bending protection layer 400 may include an organic insulating material such as an acryl resin.

The barrier layer 111, the buffer layer 120, the first gate insulating layer 141, the second gate insulating layer 142, and the inter-insulating layer 160, which may be inorganic related layers, may be removed from the bending region BR. This is because the inorganic insulating layers are vulnerable to cracks when bending, and wires may be damaged by the cracks.

The protection film 50 may be disposed so as to completely cover the back surface of the substrate 110, but may not be disposed in the bending region BR in order to reduce the bending stress of the bending region BR.

Figure 4:
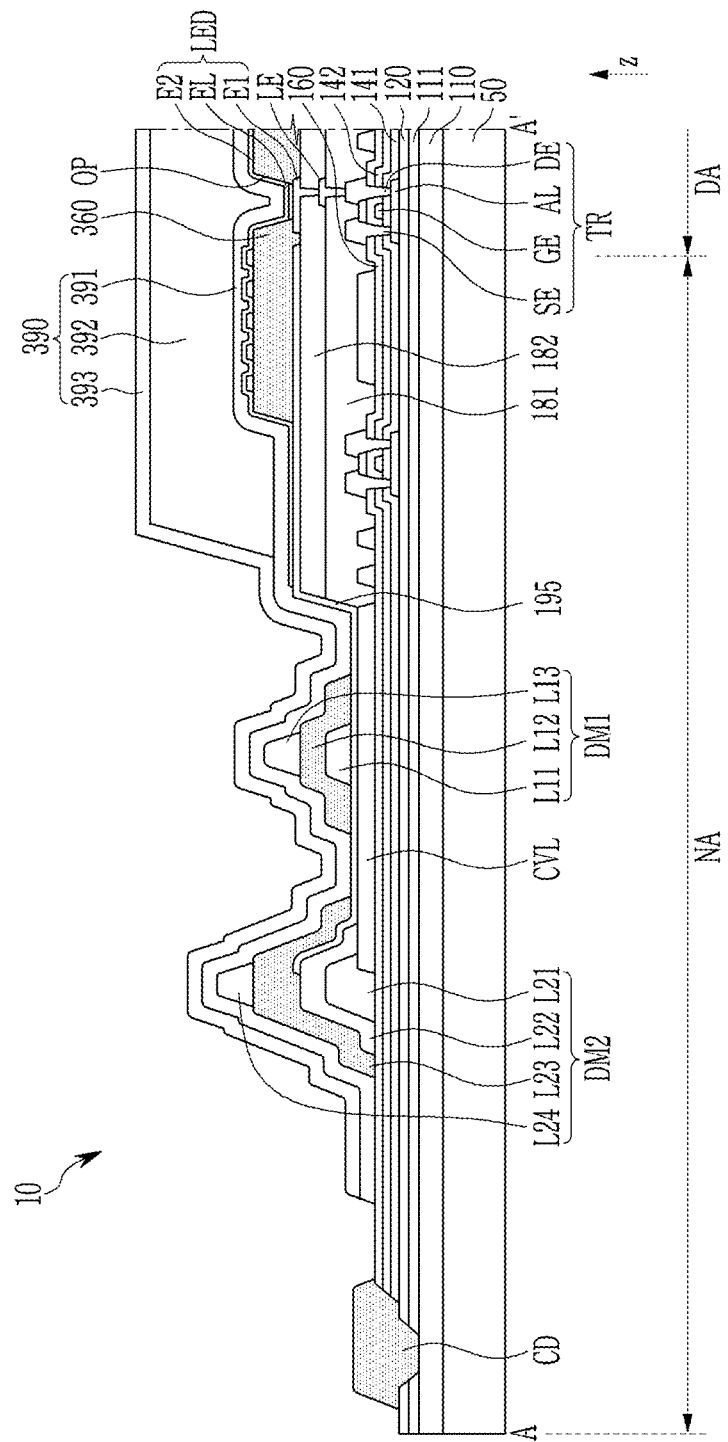
FIG. 4 illustrates a schematic cross-sectional view taken along line A-A' of an embodiment of FIG. 1.
Figure 5:
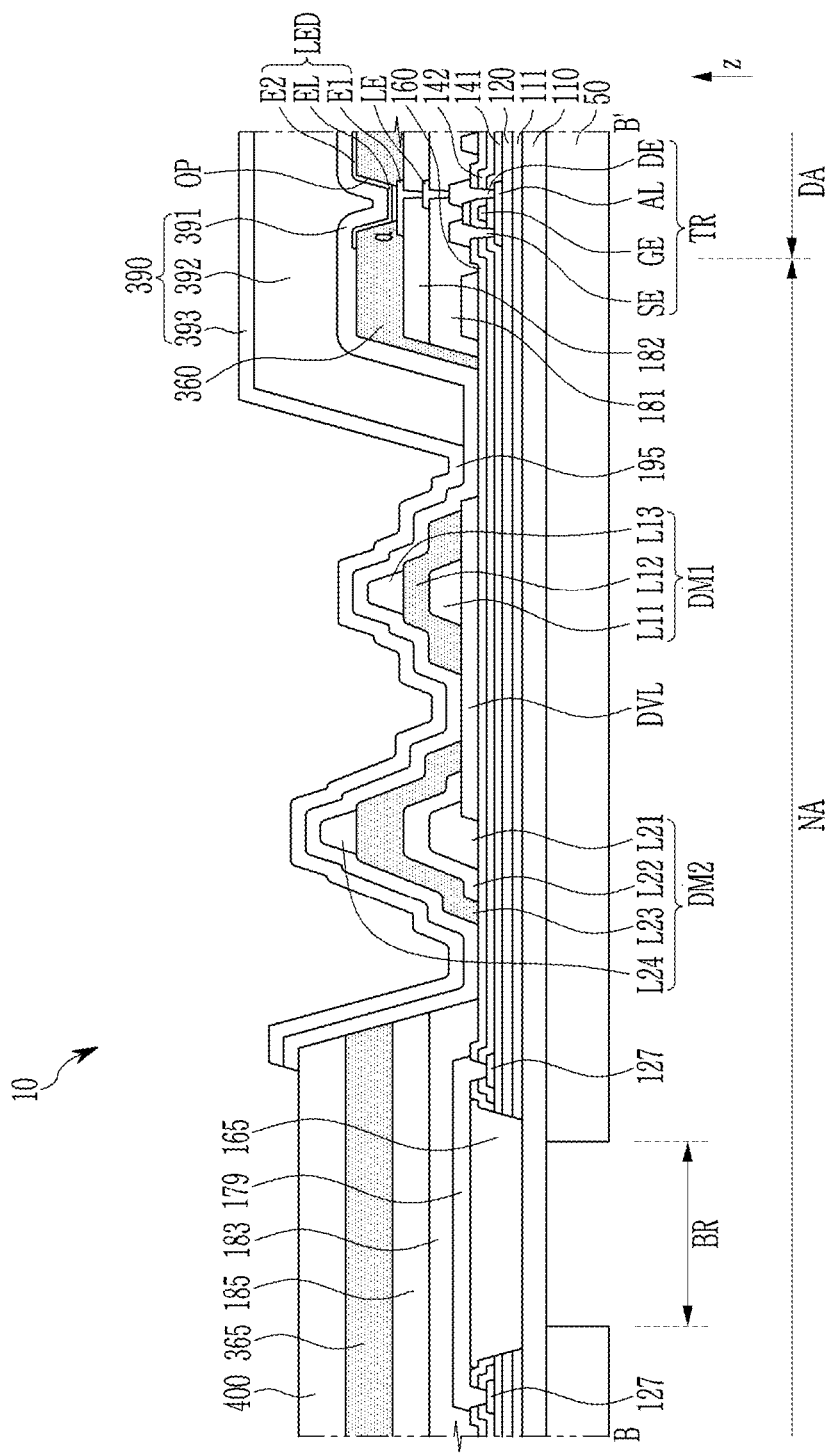
FIG. 5 illustrates a schematic cross-sectional view taken along line B-B' of an embodiment of FIG. 1.

FIG. 4 illustrates a schematic cross-sectional view taken along line A-A' of an embodiment of FIG. 1 and FIG. 5 illustrates a schematic cross-sectional view taken along line B-B' of an embodiment of FIG. 1.

The embodiment illustrated in FIGS. 4 and 5 differs from the embodiment illustrated in FIGS. 2, 3A, and 3B in a first dam DM1 and a second dam DM2. Specifically, the first dam DM1 may include a first layer L11, a second layer L12, and a third layer L13, and the second dam DM2 may include a first layer L21, a second layer L22, a third layer L23, and a fourth layer L24. That is, compared to the first dam DM1 and the second dam DM2 illustrated in FIGS. 2, 3A, and 3B, the first dam DM1 further includes the third layer L13 on the second layer L12 and the second dam DM2 further includes the fourth layer L24 on the third layer L23.

The third layer L13 of the first dam DM1 and the fourth layer L24 of the second dam DM2 may include an organic insulating material such as an acrylic polymer, an imide polymer, or an amide polymer. The third layer L13 and the fourth layer L24 may include a same material in a same process as those of spacers (not illustrated) that may be formed on a pixel defining layer 360 in a display area DA. The spacers may be formed to contact a mask, which is used upon depositing an emission layer EL, in order to prevent damage to previously formed structures by the mask. Even if the third layer L13 and the fourth layer L24 are positioned on the second layer L12 and the third layer L23, respectively, the second layer L12 and the third layer L23 may have structures and features corresponding to the second layer L12 and the third layer L23 described above.

Figure 6:
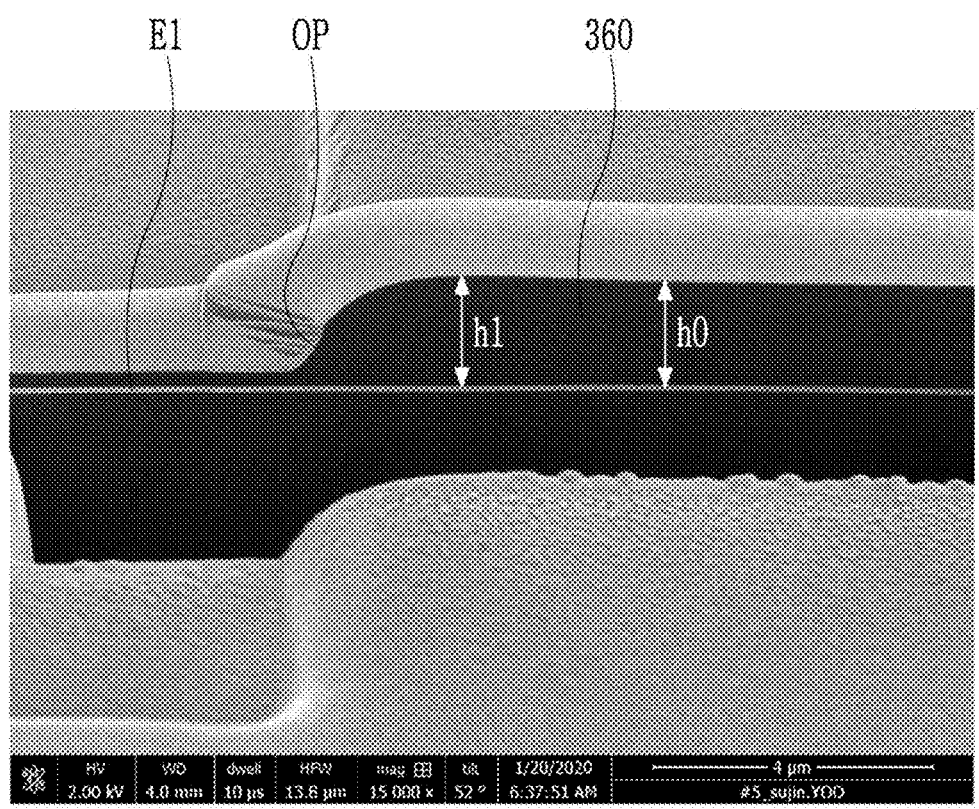
FIG. 6 illustrates an electron micrograph of a pixel defining layer in an embodiment of a display panel.
Figure 7:
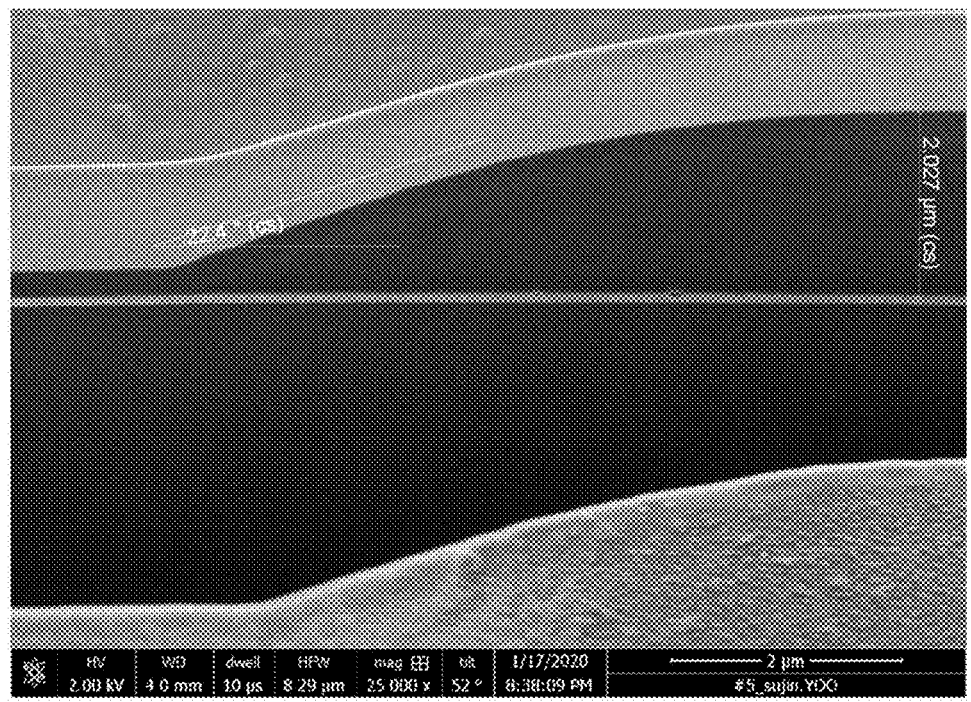
FIG. 7 illustrates an electron micrograph of a pixel defining layer in a comparative example of a display panel.
Figure 8:
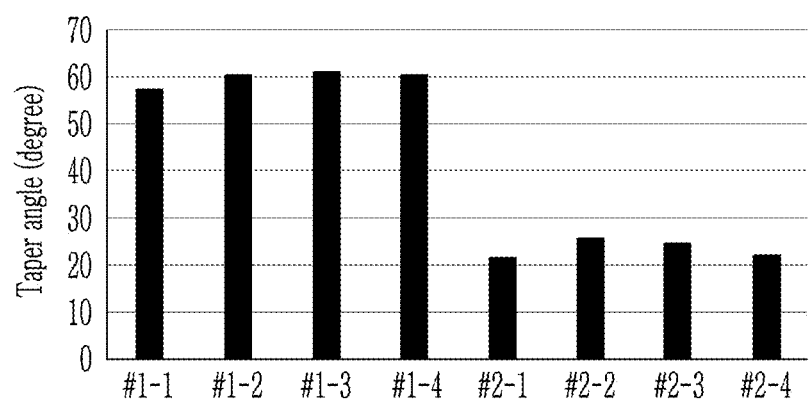
FIG. 8 illustrates a graph showing a taper angle of a pixel defining layer in an embodiment of a display panel and a comparative example of a display panel.
Figure 9:
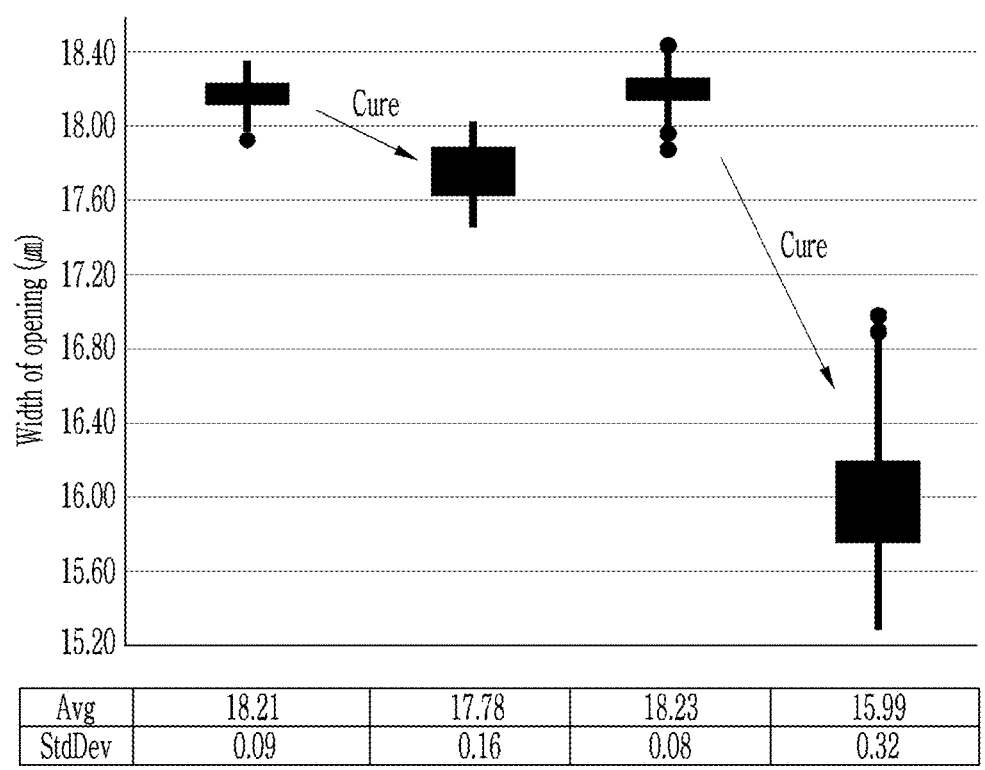
FIG. 9 illustrates a graph showing a width of an opening of a pixel defining layer in an embodiment of a display panel and a comparative example of a display panel.

FIG. 6 illustrates an embodiment of an electron micrograph of a pixel defining layer in a display panel, and FIG. 7 illustrates an electron micrograph of a pixel defining layer in a comparative example of a display panel. FIG. 8 illustrates a graph showing a taper angle of a pixel defining layer in an embodiment of a display panel and a comparative example of a display panel, and FIG. 9 illustrates a graph showing a width of an opening of a pixel defining layer in an embodiment of a display panel and a comparative example of a display panel.

The pixel defining layer 360 of the display panel in the embodiment illustrated in FIG. 6 is provided by coating a black photoresist and patterning it through a photolithography process, followed by full exposure and curing. The pixel defining layer of the comparative example of the display panel illustrated in FIG. 7 is provided by coating the black photoresist and patterning it through the photolithography process, followed by curing. In a process for forming pixel defining layer 360 of FIG. 6, a full exposure process is added between the photolithography process and a curing process compared to the pixel defining layer of FIG. 7.

Referring to FIG. 6, the first height h1 of a portion adjacent to the edge defining the opening OP of the pixel defining layer 360 is greater than the reference height h0 of a portion disposed farther from the opening OP than the portion having the first height h1 is from the opening OP. In contrast, referring to FIG. 7, a height gradually increases as a distance from the edge of the pixel defining layer increases.

Referring to FIG. 8, taper angles of the pixel defining layer #1-1, #1-2, #1-3, and #1-4 of the embodiment of the display panel 10 are illustrated at a left side thereof, and taper angles of the pixel defining layer #2-1, #2-2, #2-3, and #2-4 of the comparative example of the display panel are illustrated at a right side thereof. The pixel defining layer in the embodiment has taper angles in the range of about 58° to about 61°. The comparative example of the pixel defining layer has taper angles in the range of about 22° to 26°. The taper angles of the embodiment of the pixel defining layer are about 2.5 times greater than those of the comparative example of the pixel defining layer. This is because, as in the embodiment, a flow amount of photoresist is reduced by the full exposure before curing.

Referring to FIG. 9, two left ones of four box plots represent widths of openings before and after curing of the pixel defining layer in the embodiment of the display panel, and two right ones represent widths of openings before and after curing of the pixel defining layer in the comparative example of the display panel. In both the example and the comparative example, the widths of the openings of the pixel defining layer are reduced after curing compared to before. This is because the shape of the openings changes due to the flow of the photoresist during curing. After curing, a standard deviation of the widths of the openings of the embodiment of the pixel defining layer is 0.16, but a standard deviation of the widths of the openings of the comparative of the pixel defining layer is 0.32. From these results, it may be seen that a dispersion of openings in the pixel defining layer is remarkably improved by performing the full exposure before curing as in the example.

Figure 10:
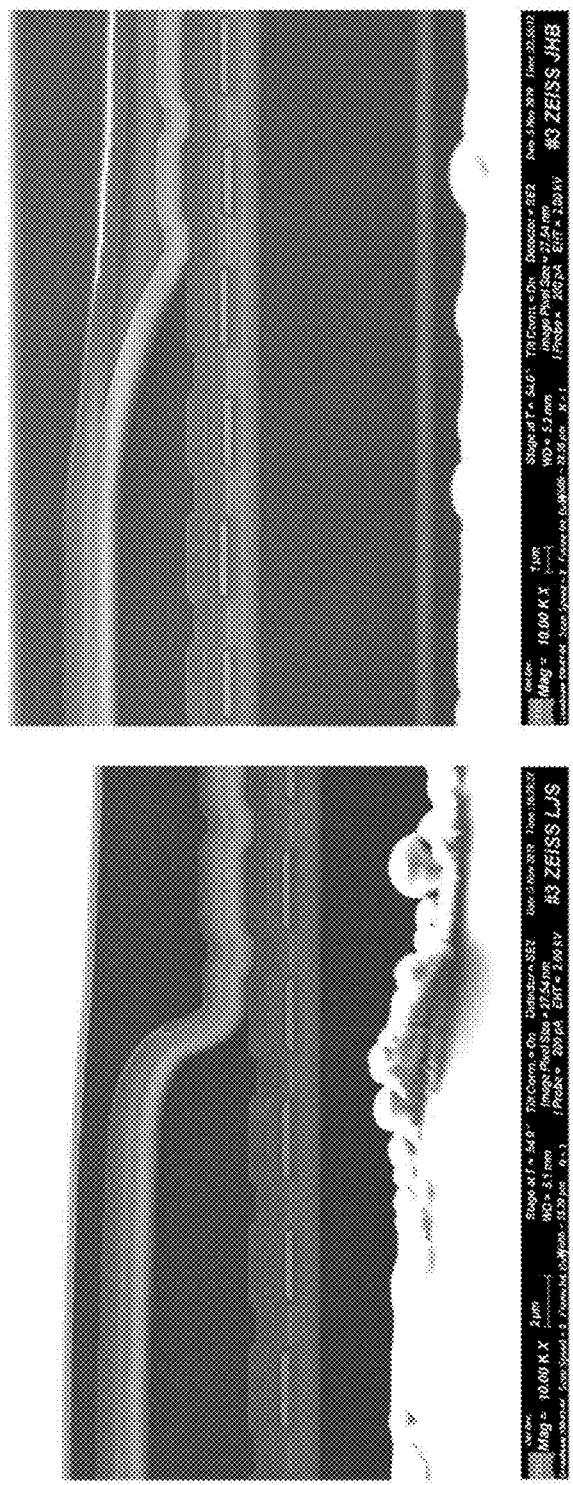
FIG. 10 illustrates an electron micrograph of an edge portion of a first dam in an embodiment of a display panel and a comparative example of a display panel
Figure 11:
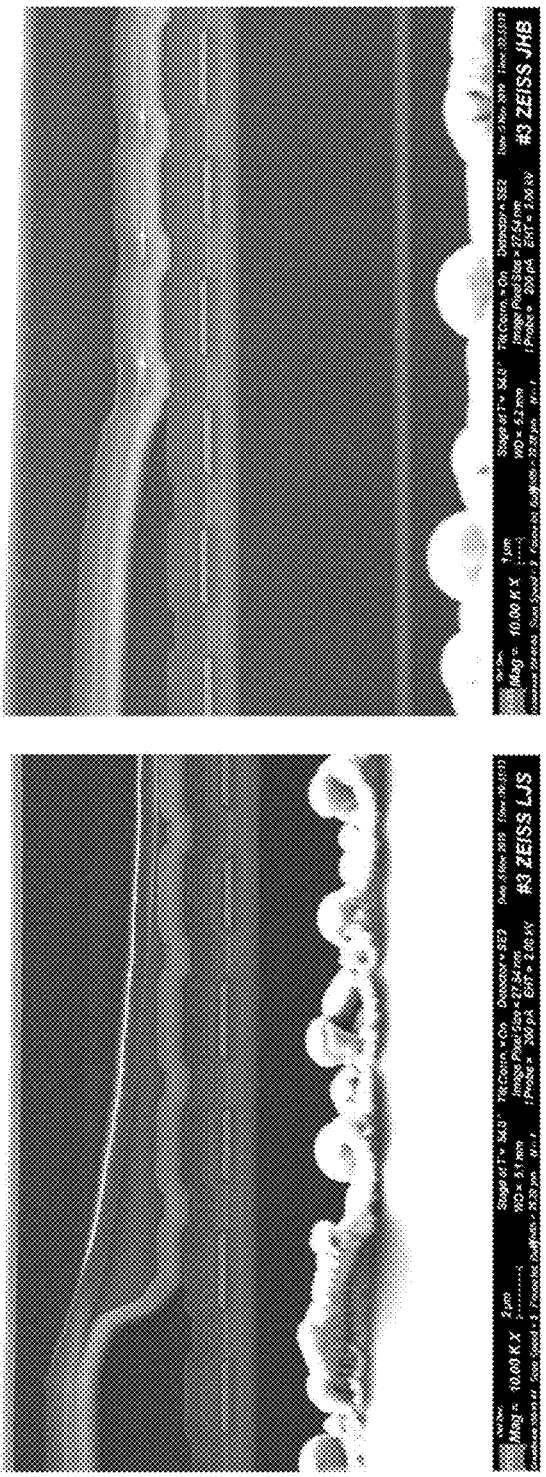
FIG. 11 illustrates an electron micrograph of an edge portion of a second dam in an embodiment of a display panel and a comparative example of a display panel.

FIG. 10 illustrates an electron micrograph of an edge portion of a first dam in an embodiment of a display panel and a comparative example of a display panel, and FIG. 11 illustrates an electron micrograph of an edge portion of a second dam in an embodiment of a display panel and a comparative example of a display panel.

A portion illustrated in FIG. 10 corresponds to the second layer L12 of the first dam DM1, and a portion illustrated in FIG. 11 corresponds to the third layer L23 of the second dam DM2. The second layer L12 of the first dam DM1 and the third layer L23 of the second dam DM2 included the same material in the same process as those of the pixel defining layer 360. Therefore, the black photoresist was patterned and exposed before curing.

Referring to FIG. 10, in the comparative example of the display panel, a height of the second layer of the first dam gradually decreases toward an edge thereof. In the embodiment of the display panel, a height of the second layer L12 of the first dam DM1 is substantially constant and then decreases relatively rapidly along a direction toward an edge thereof. Referring to FIG. 11, in the comparative example of the display panel, a height of the third layer of the second dam gradually decreases toward an edge thereof. In the embodiment of the display panel, a height of the third layer L23 of the second dam DM2 is substantially constant, slightly increases, and then decreases relatively rapidly along a direction toward an edge thereof. Such morphological characteristics of the first dam DM1 and the second dam DM2 are considered to be due to a fact that the photoresist is further subjected to photopolymerization and photocuring by the full exposure, thereby suppressing the flow of the photoresist during curing.

Figure 12:
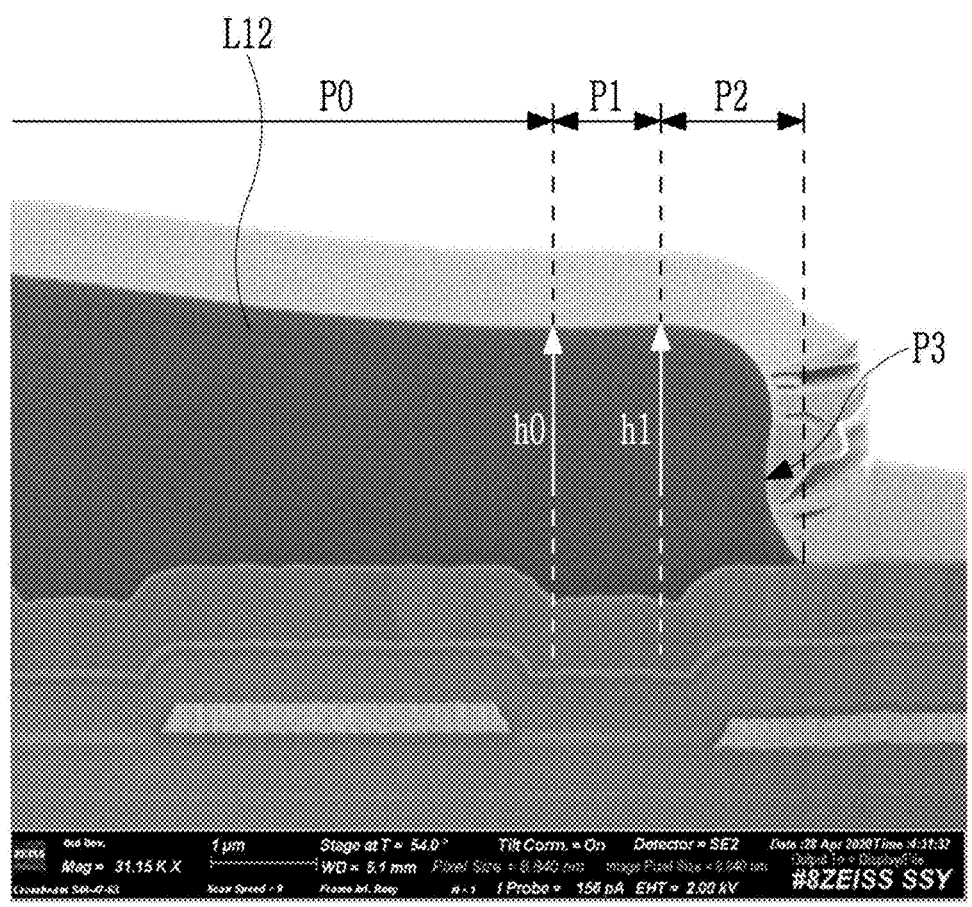
FIG. 12 illustrates an electron micrograph of an edge portion of a first dam in an embodiment of a display panel.

FIG. 12 illustrates an electron micrograph of an edge portion of a first dam in an embodiment of a display panel.

The micrograph of FIG. 12 shows a cross-sectional structure of the second layer L12 of the first dam DM1 as shown in the micrograph of FIG. 10, but corresponds to an edge portion that is far from the display area DA. The height of the second layer L12 of the first dam DM1 gradually decreases, slightly increases, and then decreases rapidly along a direction toward an edge thereof. That is, the second layer L12 includes a portion P0 having a height that gradually decreases, a portion P1 having a height that gradually increases, and a portion P2 having a height that gradually decreases and then rapidly decreases along a direction toward the edge. By this change in height, the first height h1 of the portion adjacent to the edge (e.g., boundary between the portions P1 and P2) is greater than the reference height h0 of an inner side thereof (e.g., a boundary between the portions P0 and P1). Herein, the first height h1 and the reference height h0 each indicate a height from the surface of the substrate 110 as described above. In addition, the second layer L12 includes a portion P3 that is slightly recessed from a side surface thereof. Accordingly, three inflection points may exist in a curve defined by upper and side surfaces of the edge portion of the second layer L12. The taper angle was measured to be 60.8°.

Figure 13:
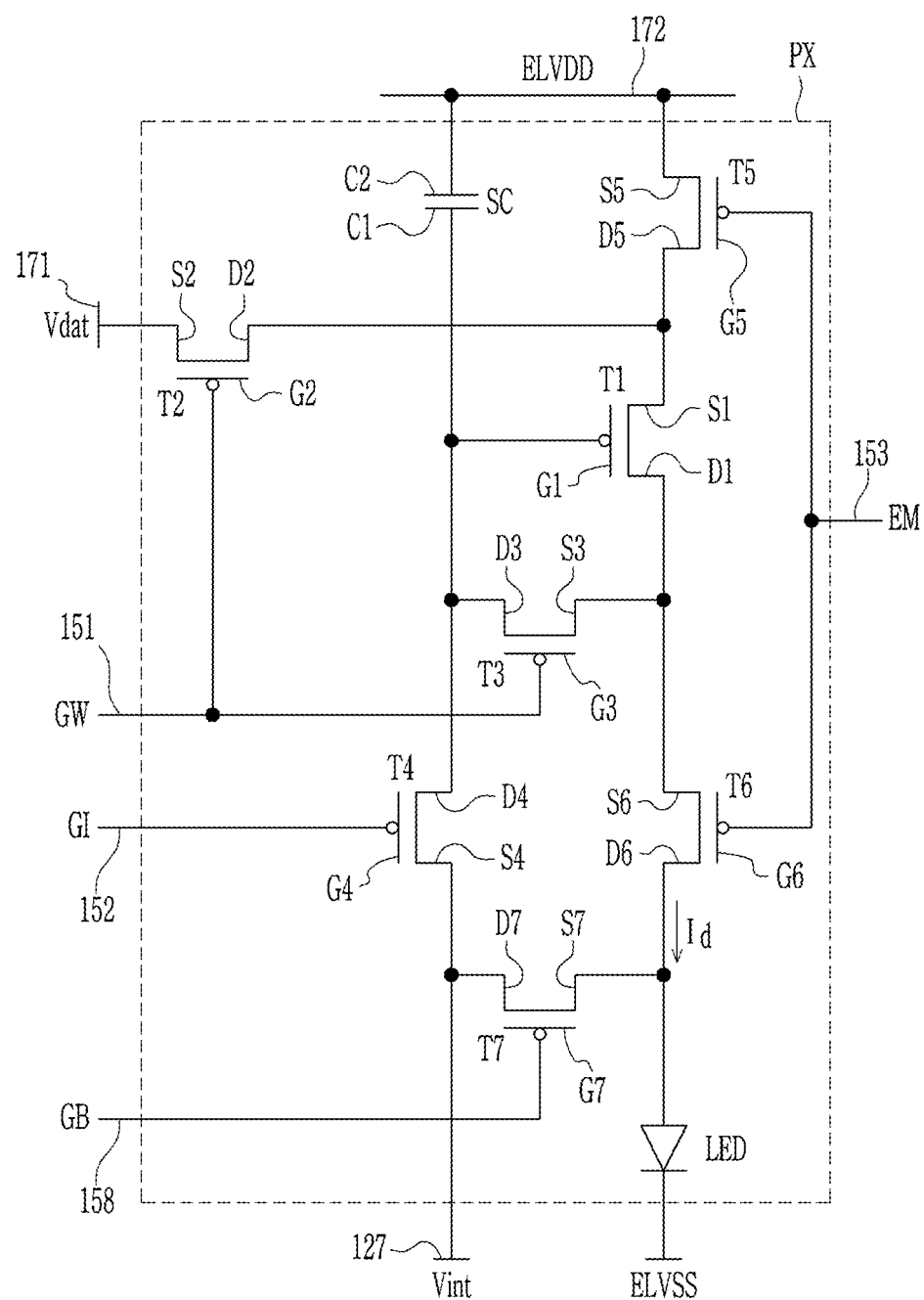
FIG. 13 illustrates an equivalent circuit diagram of an embodiment of a pixel of a display device.

FIG. 13 illustrates an equivalent circuit diagram of an embodiment of a pixel of a display device.

Referring to FIG. 13, the pixel PX may include transistors T1 to T7 connected to signal lines 127, 151, 152, 153, 158, 171, and 172, a storage capacitor CS, and a light emitting diode LED.

The transistors T1 to T7 include a driving transistor T1, a switching transistor T2, a compensation transistor T3, an initialization transistor T4, an operation control transistor T5, an emission control transistor T6, and a bypass transistor T7.

The signal lines 127, 151, 152, 153, 158, 171, and 172 may include an initialization voltage line 127, a scan line 151, a previous-stage scan line 152, an emission control line 153, a bypass control line 158, a data line 171, and a driving voltage line 172.

The scan line 151 may transfer a scan signal GW to the switching transistor T2 and the compensation transistor T3. The previous-stage scan line 152 may transfer a previous-stage scan signal GI to the initialization transistor T4. The emission control line 153 may transfer an emission control signal EM to the operation control transistor T5 and the emission control transistor T6. The bypass control line 158 may transfer a bypass signal GB to the bypass transistor T7. The bypass control line 158 may be connected to the previous-stage scan line 152.

The data line 171 may receive a data voltage Vdat, and the driving voltage line 172 and the initialization voltage line 127 may receive a driving voltage ELVDD and an initialization voltage Vint, respectively. The initialization voltage Vint may initialize the driving transistor T1.

The respective transistors T1 to T7 include gate electrodes G1 to G7, source electrodes S1 to S7, and drain electrodes D1 to D7, and the storage capacitor CS includes a first electrode C1 and a second electrode C2. The electrodes of the transistors T1 to T7 and the storage capacitor CS may be connected as illustrated in FIG. 13. An anode of the light emitting diode LED, which may be an organic light emitting diode, may be connected to the drain electrode D1 of the driving transistor T1 through the emission control transistor T6 to receive a driving current Id. A cathode of the light emitting diode LED may receive a common voltage ELVSS.

In a circuit structure of the pixel PX, a number of transistors, a number of capacitors, and connection between them may be variously modified.

A cross-sectional structure of a display panel in an embodiment will be described with reference to FIG. 14.

Figure 14:
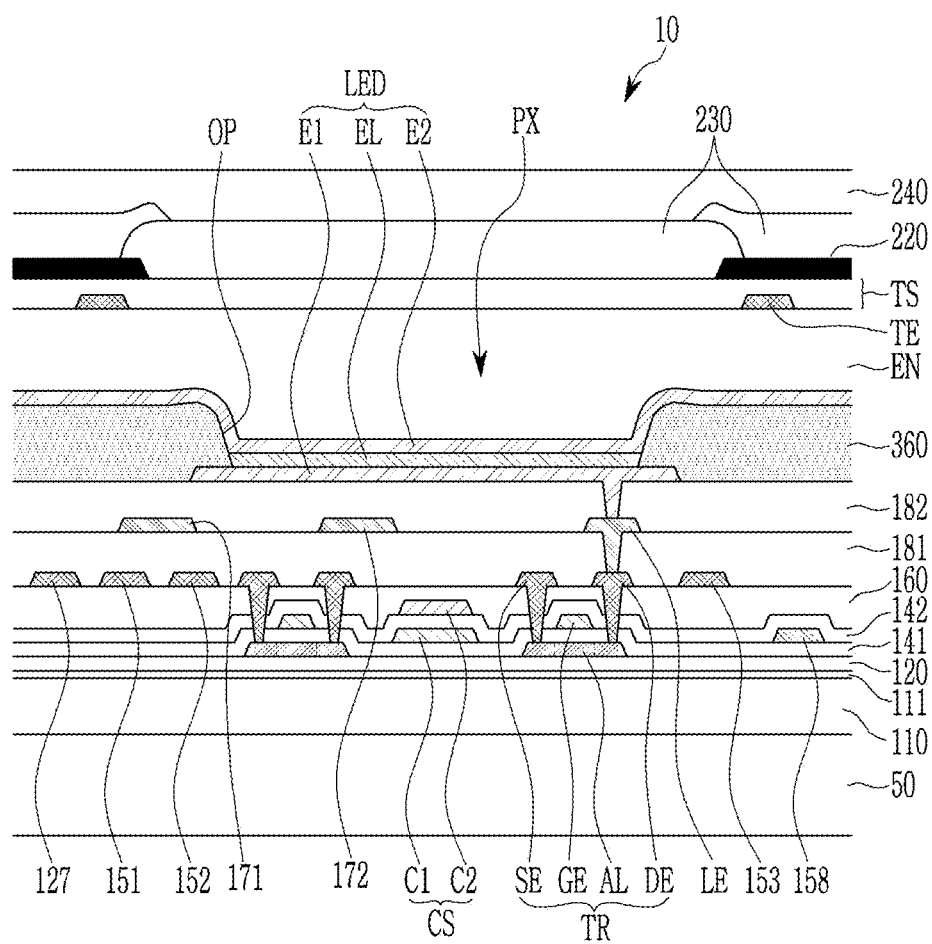
FIG. 14 illustrates a schematic cross-sectional view of an embodiment of one pixel area in a display panel.

FIG. 14 illustrates a schematic cross-sectional view of an embodiment of one pixel area in a display panel. Although the cross-sectional structure has been described with reference to FIG. 2 and FIGS. 3A and 3B, a further description will be given centering on the display area DA.

Referring to FIG. 14, the display panel 10 may have a structure in which several layers, wires, and elements are stacked on a substrate 110 to configure and drive the pixels PX.

A barrier layer 111 and a buffer layer 120 may be disposed on the flexible substrate 110. The semiconductor layer AL of a transistor TR may be disposed on the buffer layer 120.

A first gate insulating layer 141 may be disposed on the semiconductor layer AL. A first gate conductor that may include a gate electrode GE of the transistor TR, a bypass control line 158, a first electrode C1 of the storage capacitor CS, and the like may be disposed on the first gate insulating layer 141. The gate electrode GE may overlap a channel region of the semiconductor layer AL.

A second gate insulating layer 142 may be disposed on the first gate conductor. A second gate conductor that may include a second electrode C2 of the storage capacitor CS and the like may be disposed on the second gate insulating layer 142. An inter-insulating layer 160 may be disposed on the second gate conductor.

A first data conductor that may include a source electrode SE and a drain electrode DE of the transistor TR, an initialization voltage line 127, a scan line 151, a previous-stage scan line 152, an emission control line 153, and the like may be disposed on the inter-insulating layer 160. At least one of the initialization voltage line 127, the scan line 151, the previous-stage scan line 152, and the emission control line 153 may be included in the first gate conductor or the second gate conductor.

A first planarization layer 181 may be disposed on the first data conductor. A second data conductor that may include a data line 171, a driving voltage line 172, and a connection electrode LE may be disposed on the first planarization layer 181. The data line 171 and/or the driving voltage line 172 may be included in the first data conductor. A second planarization layer 182 may be disposed on the second data conductor.

A first electrode E1 of the light emitting diode LED is disposed on the second planarization layer 182. The first electrode E1 may be electrically connected to the drain electrode DE through the connection electrode LE.

A black pixel defining layer 360 in which an opening OP overlapping the first electrode E1 is defined may be disposed on the second planarization layer 182. An emission layer EL may be disposed on the first electrode E1, and a second electrode E2 of the light emitting diode LED may be disposed on the emission layer EL. At least one protective layer or functional layer may be disposed on the second electrode E2.

An encapsulation layer EN may be disposed on the second electrode E2. The encapsulation layer EN may be a thin film encapsulation layer including one or more inorganic layers and one or more organic layers which are stacked on the second electrode E2. The encapsulation layer EN may be provided in a form of a substrate.

A touch sensor layer TS including a touch electrode TE may be disposed on the encapsulation layer EN. The touch sensor layer TS may be used to sense a user contact and/or non-contact touch. The touch electrode TE may include a metal mesh, a transparent conductive material, a conductive polymer, or the like. The touch sensor layer TS may be disposed on the encapsulation layer EN, or may be disposed on a separate substrate to be attached to the encapsulation layer EN. An inorganic insulating layer may be disposed between the encapsulation layer EN and the touch sensor layer TS.

A light blocking member 220 may be disposed on the touch sensor layer TS. The light blocking member 220 may include a black pigment or dye, and may reduce or prevent light reflection caused by a metal layer of the display panel 10 and the like. The light blocking member 220 may be disposed so as not to overlap the opening OP as an emission region. The light blocking member 220 may be also referred to as a black matrix.

A color filter 230 may be disposed on the touch sensor layer TS. The color filter 230 may transmit any one of red, green, and blue light. Color filters 230 representing different colors may overlap in a region overlapping the light blocking member 220. The color filter 230 and the light blocking member 220 may be combined to function as an anti-reflection layer. In such a structure, a polarization layer may not be desired as an anti-reflection layer, and a thickness of the display panel 10 may be reduced. The color filter 230 may include quantum dots or phosphors, and may convert light emitted from the light emitting diode LED into red or green light. An overcoat layer 240 may be disposed on the color filter 230.

A protection film 50 may be disposed under the substrate 110. While the invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a substrate including a display area and a non-display area;
    a black pixel defining layer disposed in the display area;
    a light emitting element disposed in the display area;
    an encapsulation layer covering the light emitting element; and
    a dam disposed in the non-display area and surrounding the display area, wherein the dam includes a plurality of organic layers, the plurality of organic layers including an organic layer having an upper surface facing the encapsulation layer, and the upper surface of the organic layer includes a portion which decreases and then increases in height toward an edge defining a side surface of the organic layer, which connects with the upper surface of the organic layer, and
    wherein the dam includes a first organic layer and a second organic layer, an entirety of the second organic layer directly covers and is directly in contact with an upper surface and an outermost side surface of the first organic layer, the second organic layer consists of a single layer, and the second organic layer includes a same material as a material of the black pixel defining layer,
    wherein the second organic layer includes a first portion adjacent to the edge and a second portion disposed inside the first portion, and
    wherein a height of the first portion from a surface of the substrate is greater than a height of the second portion from the surface of the substrate by a height difference in a range from 0.3 μm to 0.5 μm.

2. The display device of claim 1, wherein the organic layer includes a black photoresist.

3. The display device of claim 1, wherein at least two inflection points are included in a curve defined by an upper surface of an edge portion of the organic layer in a cross-sectional view.

4. The display device of claim 1, further comprising
a power supply voltage transfer line disposed in the non-display area, and
wherein the organic layer includes a portion which is in contact with the power supply voltage transfer line.

5. The display device of claim 4, further comprising
a connecting member electrically connecting an electrode of the light emitting element and the power supply voltage transfer line,
wherein the organic layer includes a portion which is in contact with the connecting member.

6. The display device of claim 4, further comprising
an insulating layer disposed between the substrate and the power supply voltage transfer line,
wherein the organic layer includes a portion which is in contact with the insulating layer.

7. The display device of claim 1, wherein
the encapsulation layer includes an inorganic layer, and the inorganic layer extends over the organic layer and contacts the organic layer.

8. The display device of claim 1, wherein an opening is defined in the black pixel defining layer, and
a height of a first portion of the black pixel defining layer adjacent to an edge of the black pixel defining layer for defining the opening is greater than a height of a second portion disposed farther from the opening than the first portion is from the opening.

9. The display device of claim 8, further comprising
a light blocking member and a color filter disposed on the black pixel defining layer and overlap the black pixel defining layer.

10. A display device comprising:
a substrate including a display area and a non-display area;
a black pixel defining layer which is disposed in the display area and in which an opening is defined;
a light emitting diode disposed in the display area and overlapping the opening;
a thin film encapsulation layer covering the light emitting diode; and
a dam disposed in the non-display area and surrounding the display area,
wherein the dam includes a first organic layer and a second organic layer, an entirety of the second organic layer directly covers and is directly in contact with an upper surface and an outermost side surface of the first organic layer, the second organic layer consists of a single layer, and the second organic layer includes a same material as a material of the black pixel defining layer,
wherein the second organic layer includes a first portion adjacent to an edge defining a side surface of the second organic layer and a second portion disposed inside the first portion, and
wherein a height of the first portion from a surface of the substrate is greater than a height of the second portion from the surface the substrate by a height difference in a range from 0.3 µm to 0.5 µm.

11. The display device of claim 10, wherein
the black pixel defining layer and the second organic layer include a black photoresist.

12. The display device of claim 10, wherein
at least three inflection points are included in a curve defined by an upper surface and a side surface of an edge portion of the second organic layer in a cross-sectional view.

13. The display device of claim 10, further comprising
a power supply voltage transfer line disposed in the non-display area,
wherein the second organic layer includes a portion which is in contact with the power supply voltage transfer line.

14. The display device of claim 13, further comprising
a connecting member electrically connecting an electrode of the light emitting diode and the power supply voltage transfer line,
wherein the second organic layer includes a portion which is in contact with the connecting member.

15. The display device of claim 13, further comprising
an insulating layer disposed between the substrate and the power supply voltage transfer line,
wherein the second organic layer includes a portion which is in contact with the insulating layer.

16. The display device of claim 10, wherein
the thin film encapsulation layer includes an inorganic layer, and the inorganic layer extends over the second organic layer and contacts the second organic layer.

17. The display device of claim 10, further comprising
a planarization layer disposed between the substrate and the black pixel defining layer,
wherein the first organic layer includes a same material as a material of the planarization layer.

18. The display device of claim 10, further comprising
a light blocking member and a color filter disposed on the black pixel defining layer and overlapping the black pixel defining layer.

* * * * *